United States Patent
Brida et al.

(10) Patent No.: US 9,643,836 B2
(45) Date of Patent: May 9, 2017

(54) METHOD FOR PRODUCING A PRESSURE SENSOR AND CORRESPONDING SENSOR

(71) Applicants: AUXITROL S.A., Bourges (FR); CENTRE NATIONAL DE LA RECHERCHE SCIENTIFIQUE (CNRS), Paris (FR)

(72) Inventors: Sebastiano Brida, Salles sur l'Hers (FR); Jean-Francois Le Neal, Neuchatel (CH)

(73) Assignees: AUXITROL S.A., Bourges (FR); CENTRE NATIONAL DE LA RECHERCHE SCIENTIFIQUE (CNRS), Paris (FR)

( * ) Notice: Subject to any disclaimer, the term of this patent is extended or adjusted under 35 U.S.C. 154(b) by 0 days.

(21) Appl. No.: 14/383,092

(22) PCT Filed: Mar. 6, 2013

(86) PCT No.: PCT/EP2013/054531
§ 371 (c)(1),
(2) Date: Sep. 4, 2014

(87) PCT Pub. No.: WO2013/131973
PCT Pub. Date: Sep. 12, 2013

(65) Prior Publication Data
US 2015/0033878 A1 Feb. 5, 2015

(30) Foreign Application Priority Data
Mar. 6, 2012 (FR) ..................... 12 52042

(51) Int. Cl.
*H01S 4/00* (2006.01)
*G01R 3/00* (2006.01)
(Continued)

(52) U.S. Cl.
CPC ............ *B81B 3/0021* (2013.01); *B32B 38/08* (2013.01); *B81B 7/02* (2013.01); *B81C 1/00182* (2013.01);
(Continued)

(58) Field of Classification Search
CPC ............ B32B 38/08; B81B 2201/0264; B81B 2203/0127; B81B 2207/07;
(Continued)

(56) References Cited

U.S. PATENT DOCUMENTS 4,295,115 A * 10/1981 Takahashi ........... G01L 19/0069
257/E29.324
4,625,561 A * 12/1986 Mikkor ................. G01L 9/0073
29/25.41
(Continued)

FOREIGN PATENT DOCUMENTS

JP          2008002994 A    1/2008
WO         WO0208713 A1    1/2002

*Primary Examiner* — Jonathan Dunlap
(74) *Attorney, Agent, or Firm* — Blakely Sokoloff Taylor & Zafman LLP (57) ABSTRACT

The invention relates to a method for producing a pressure sensor, comprising the following steps: assembling a support substrate with a deformable membrane on which strain gauges have been deposited, wherein the deformable membrane comprises a thinned area at the center thereof, the support substrate is disposed on top of the deformable membrane, the support substrate comprises an upper surface and a lower surface in contact with the deformable membrane, and the support substrate also comprises lateral recesses arranged on top of the strain gauges and a central recess arranged on top of the thinned area of the membrane, so as to obtain a micromechanical structure; and, once the assembly has been obtained, depositing, in a single step, at least one conductive material on the upper surface of the support and in the lateral recesses of the support, said
(Continued)

conductive material extending into the recesses in order to be in contact with the strain gauges so as to form electrical contacts in contact with the strain gauges.

11 Claims, 6 Drawing Sheets (51) Int. Cl.
*B81B 3/00* (2006.01)
*G01L 9/04* (2006.01)
*G01L 9/06* (2006.01)
*B81C 1/00* (2006.01)
*B32B 38/08* (2006.01)
*B81B 7/02* (2006.01)
*G01L 7/08* (2006.01)
*G01L 9/00* (2006.01)
*G01L 19/14* (2006.01)
*B81B 7/00* (2006.01)
*G01L 19/00* (2006.01)

(52) U.S. Cl.
CPC ............ *B81C 1/00341* (2013.01); *G01L 7/08* (2013.01); *G01L 9/006* (2013.01); *G01L 9/0045* (2013.01); *G01L 9/0052* (2013.01); *G01L 9/04* (2013.01); *G01L 9/06* (2013.01); *G01L 19/0069* (2013.01); *G01L 19/0076* (2013.01); *B81B 7/0006* (2013.01); *B81B 2201/0264* (2013.01); *B81B 2203/0127* (2013.01); *B81B 2207/07* (2013.01); *B81B 2207/095* (2013.01); *B81B 2207/096* (2013.01); *G01L 9/008* (2013.01); *G01L 9/0054* (2013.01); *G01L 9/0055* (2013.01); *G01L 19/0061* (2013.01); *G01L 19/147* (2013.01); *G01L 19/148* (2013.01); *H01L 2224/45169* (2013.01); *Y10T 29/49888* (2015.01); *Y10T 156/10* (2015.01)

(58) Field of Classification Search
CPC ........ B81B 2207/095; B81B 2207/096; B81B 3/0021; B81B 7/0006; B81C 1/00182; B81C 1/00341; G01L 19/0061; G01L 19/0069; G01L 19/0076; G01L 19/147; G01L 19/148; G01L 7/08; G01L 9/0045; G01L 9/0052; G01L 9/0054; G01L 9/0055; G01L 9/006; G01L 9/008; G01L 9/04; G01L 9/06; H01L 2224/45169
USPC ......... 73/754, 715, 721, 727, 719, 720, 756; 29/592.1, 595
See application file for complete search history.

(56) References Cited

U.S. PATENT DOCUMENTS

| | | | | |
|---|---|---|---|---|
| 6,330,829 | B1* | 12/2001 | Kurtz | G01L 9/0055 73/717 |
| 6,338,284 | B1* | 1/2002 | Najafi | B81B 7/0006 216/2 |
| 6,612,175 | B1* | 9/2003 | Peterson | G01L 9/0042 73/708 |
| 7,152,478 | B2* | 12/2006 | Peterson | G01L 9/0042 73/715 |
| 7,540,198 | B2* | 6/2009 | Ichikawa | G01L 9/0054 73/721 |
| 7,849,749 | B2* | 12/2010 | Yamamoto | G01L 9/0054 73/727 |
| 7,987,727 | B2* | 8/2011 | Fujioka | G01L 9/0042 73/725 |
| 8,349,707 | B2* | 1/2013 | Bieck | H01L 21/76898 257/619 |
| 2004/0103724 | A1 | 6/2004 | Takizawa et al. | |
| 2008/0163695 | A1* | 7/2008 | Ichikawa | G01L 9/0055 73/721 |
| 2011/0073969 | A1 | 3/2011 | Benzel et al. | |
| 2011/0271764 | A1* | 11/2011 | Lee | G01L 19/0092 73/718 |
| 2012/0244665 | A1* | 9/2012 | Sakai | H01L 24/11 438/123 |
| 2013/0137207 | A1* | 5/2013 | Suminto | B81C 1/00158 438/53 |

* cited by examiner

METHOD FOR PRODUCING A PRESSURE SENSOR AND CORRESPONDING SENSOR

GENERAL TECHNICAL FIELD

The invention relates to the manufacture of a micromechanical structure for measuring or detecting a mechanical magnitude or a physical magnitude and in particular a pressure sensor comprising such a microstructure.

PRIOR ART

As is known, a pressure sensor comprises a micromechanical structure "Micro Electro Mechanical Systems" (MEMS) comprising a deformable membrane assembled on a support partially separated by a cavity having a prevailing reference pressure, a vacuum for example.

Strain gauges supported by the membrane can measure strains caused by deformations undergone by the membrane subjected to an external energy supply (such as for example pressure P applied to the membrane), by observing modifications of physical and/or electrical properties of the structure associated with deformations (such as for example a change in electrical resistance or internal strains).

Pressure sensors of this type are intended to be used in hostile environments and must be protected from the exterior.

To do this, the micromechanical structure is placed in a protective casing: encapsulation of the micromechanical structure (more generally this is encapsulation of the micromechanical structure in terms of protecting the micromechanical structure). Once in the casing, the pressure to be measured is sent from the casing to the strain gauges by means of a transmission interface generally constituted by oil. Such casing is known by its English name <<packaging>>.

Such packaging does have drawbacks, however.

The presence of oil limits use of the resulting sensor at a temperature of the order of 200° C.

Also, the sensor has a precision limited by the presence of intermediate elements having interactions with the micromechanical structure (oil and adhesive), affecting in particular long-term precision and stability.

For a few years now, to rectify these disadvantages the encapsulation of the micromechanical structure can be executed at time of manufacture of the micromechanical structure "Wafer Level Packaging".

But known methods do have the following disadvantages.

The choice of materials used to define the electrical contacts are limited, causing strains during assembly of the structure.

A glass paste is often used for the connections, creating considerable contact resistances, which can evolve over time under the effect of temperature.

Electrical wires are used and this can embrittle the structure.

The invention is made in this context to propose a manufacturing method of a pressure sensor.

PRESENTATION OF THE INVENTION

According to a first aspect, the invention proposes a manufacturing method of a sensor which, because of its very design combines in a single phase the manufacture and protection of a sensitive element of micromechanical structure.

For this purpose, the invention proposes a manufacturing method of a pressure sensor comprising the following steps:

assembly of a support substrate with a deformable membrane on which strain gauges have been deposited, the deformable membrane comprising a thinned zone in its centre, the support substrate being arranged above the deformable membrane, the support substrate comprising an upper surface, a lower surface in contact with the deformable membrane, the support substrate further comprising lateral recesses arranged above strain gauges and a central recess arranged above the thinned zone of the membrane, to produce a micromechanical structure; and once assembly is complete, the method comprising the following step:

deposit in a single step of at least one conductive material on the upper surface of the support and in the lateral recesses of the support, the conductive material extending into the recesses to be in contact with the strain gauges to form electrical contacts linked to the strain gauges.

The invention is advantageously completed by the following characteristics, taken singly or in any technically possible combination:

it comprises, once assembly is complete and prior to the single deposit step of at least one conductive material, a deposit step of at least one diffusion barrier, in each lateral recess, the diffusion barrier being in contact with the corresponding strain gauge;

it comprises a step for formation of several electrical contacts executed by photolithography associated with a hot 3D laminating technique or coating by pulverisation of surfaces of strong topology;

the conductive material or the conductive material(s) are selected from the following group: ultradoped polysilicon, Au, Ag, Ni, Pt, TiW, Cu, Pd, Al, Ti, TiN;

the membrane is made of silicon and: the support is made of glass, the assembly consisting of anodic sealing; or the support is made of silicon, the assembly consisting of sealing by means of a molecular or atomic bond with or without an intermediate layer, or by brazing;

it comprises a step consisting of: integrating the support into a casing comprising electrical contacts made of conductive material; the support being integrated into the casing by means of connectors formed on the support;

integration of the support into the casing is done by a thermocompression method;

the thermocompression method is executed at a temperature between 250° C. and 500° C., typically 320° C. at pressure between 10 MPa and 200 MPa, typically 50 MPa;

the electrical contacts of the casing are made of material selected from the following group: ultradoped polysilicon, Au, Ag, Ni, Pt, TiW, Cu, Pd, Al, Ti, TiN;

integration of the support substrate into the casing is executed by means of the technique of the flipped chip;

the membrane is formed from a substrate, for example comprising monocrystalline silicon such as SOI or PSOI, sapphire such as SOS or else other materials such as SiCOI or SiC.

The invention also relates to a pressure sensor produced by a method according to of the invention.

And, according to a second aspect, the invention proposes a pressure sensor produced by a method according to the first aspect of the invention.

The invention has numerous advantages.

Since assembly of the support with the deformable membrane is completed prior to deposit of at least one conductive material to then produce the electrical contacts, the choice of materials is superior to that of known techniques.

The invention avoids using additional elements to create connections at the level of the strain gauges: deposit of the conductive material is done in a single step and leads to formation of the electrical contacts.

Also, the method of the invention deposits several successive conductive materials after assembly to improve the electrical contacts on the one hand and make for easier integration of the support into a connection casing on the other hand.

The method also deposits, after assembly between the support and the deformable membrane, a diffusion barrier which prevents diffusion of the material acting as electrical contacts in the strain gauges.

Also, with the method of the invention, quality of assembly of the support with the deformable membrane increases as the surface quality of the two components is not altered by the etching steps which are performed in this case downstream of the assembly.

Also, the sealing temperature is not limited by the choice of conductive materials.

Another point is that the electrical connection by direct metallic contact presents negligible contact resistance relative to the measuring in itself, and it is not subject to variations in temperatures.

Also, integration by the technique known as <<flip chip>> in a single step needs no contribution of other materials which might create limitations during the manufacturing method and/or mechanical strains between materials due to integration by thermocompression.

PRESENTATION OF FIGURES

Other characteristics, aims and advantages of the invention will emerge from the following description which is purely illustrative and non-limiting, and which must be considered relative to the appended drawings, in which.

In all figures, similar elements bear identical reference numerals.

DETAILED DESCRIPTION OF THE INVENTION

A pressure sensor comprises especially a support 10 and a deformable membrane 20, strain gauges 30 and assembly supports 40 arranged between the support 10 and the membrane 20.

Measuring of pressure can be absolute or differential.

The micromechanical structure formed by the deformable membrane and the strain gauges are therefore protected by the support 10.

The micromechanical structure is connected electrically to a casing 80 by means of the support 10 comprising electrical contacts 61, the casing 80 further comprising electrical contacts 81 arranged inside.

Advantageously, the deformable membrane 20 comprises an upper surface 201 and a lower surface 202, a diaphragm sensitive to pressure/or fine part 20b suspended above a free space and a thick part 20a forming a support of the fine part 20b.

Such a membrane 20 is typically formed from a substrate, for example comprising monocrystalline silicon such as SOT or PSOI, sapphire such as SOS or other materials such as SiCOI or SiC.

The free space (at the level of the fine part 20b of the membrane) is advantageously formed by micro-machining.

Techniques of micro-machining employed to form such a free space can for example be chemical etching, such as KOH etching at a temperature determined and/or deep reactive ion etch (DRIE) in a surface substrate of flat origin.

The thicknesses of such a membrane 20 are several tens of microns, from 100 μm to 1000 μm, typically 500 μm for the thick part 20a, and from 10 to 200 μm for the fine part 20b.

Figure 1A:
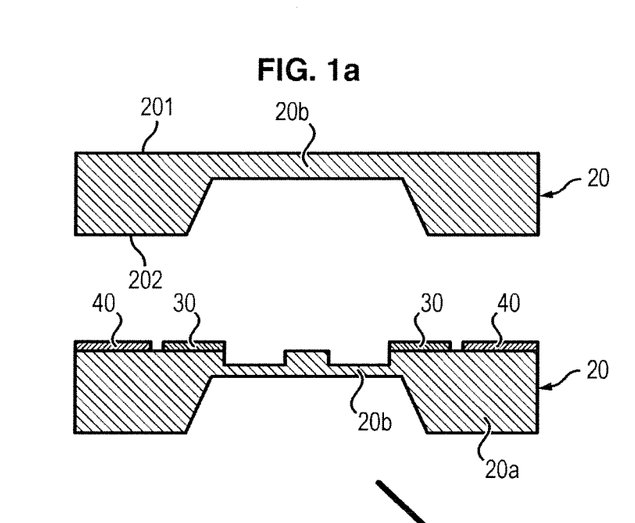
FIGS. 1a, 1b and 1c illustrate the assembly of a deformable membrane and a support according to a method in keeping with an embodiment of the invention.
Figure 1B:
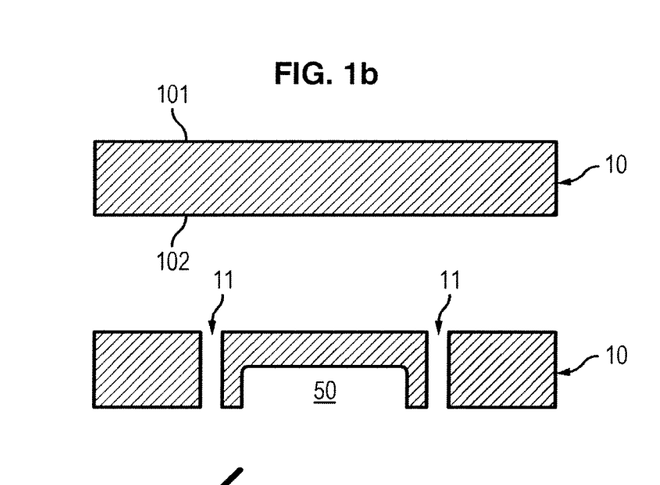
Figure 1C:
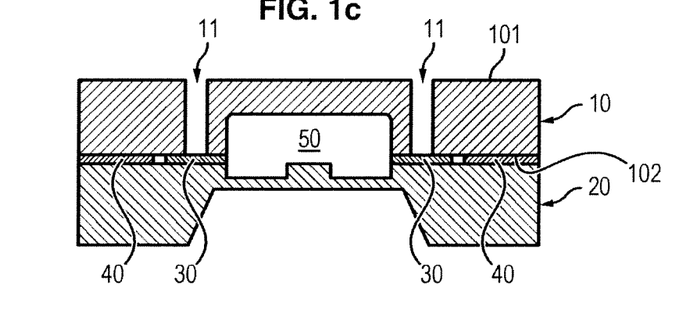

The deformable membrane 20 comprises strain gauges 30 on its upper part. The strain gauges 30 comprise microstructures made of monocrystalline silicon located on the upper surface 201 of the deformable membrane 20 (see FIG. 1a). Typically, these microstructures are usually formed from an initial layer of silicon etched by photolithography and chemical or plasma etching.

The strain gauges 30 are preferably arranged in the maximal mechanical strain zone of the deformable membrane 20.

The deformable membrane 20 also comprises on its upper surface 201 assembly supports 40 which are deposited at the ends of the thick part 20b of the deformable membrane 20.

It is also possible to provide on the upper surface 201 of the deformable membrane 20 an electrically insulating layer (not shown) such as a layer of $SiO_2$. The strain gauges 30 and the assembly supports 40 are in this case deposited on the electrically insulating layer.

The support 10 has an external cross-section identical to that of the deformable membrane 20. The support 10 also comprises an upper surface 101 and a lower surface 102 which is designed to be in contact with the upper surface 201 of the deformable membrane 20 during a method to be described hereinbelow.

The support 10 comprises lateral recesses 11 which are formed to be opposite the strain gauges 30 and a central recess 50 formed to be opposite the fine part 20b of the deformable membrane when the membrane 20 and the support 10 are assembled. The support 10 preferably comprises at least four lateral recesses 11. The lateral recesses 11 advantageously have a circular cross-section.

The lateral recesses 11 and the central recess 50 are formed from a substrate by micro-machining techniques such as KOH etching at a determined temperature and/or deep reactive ion etch (DRIE) in a surface substrate of flat origin.

The support 10 can be material based on glass, silicon quartz, Pyrex™, sapphire, alumina, Si, SiC.

The support 10, for example, has a thickness between 50 and 1000 μm.

During a manufacturing method of a pressure sensor, a support 10 is assembled E1 on a deformable membrane 20 on which strain gauges 30 and assembly supports 40 have been previously deposited.

The assembly E1 can be done by executing anodic sealing or by means of a molecular or atomic bond with or without intermediate layer, or by brazing.

Of course, other possibilities for assembling the support 10 with the deformable membrane 20 are feasible, possibilities known to the expert and which will not be described here.

After assembly E1, in a single step, at least one conductive material 60 is deposited E2 in the lateral recesses 11 of the support 10 and on the upper surface 101 of the support 10. So, the conductive material 60 extends into the lateral recesses 11 to be in contact with the strain gauges 30 and to then form electrical contacts 61 linked to the strain gauges 30.

Such deposit E2 comprises especially deposit of a film of conductive material(s) onto the upper surface 101 of the support 10 (opposite the lower surface 102 of the support 10 in contact with the deformable membrane 20).

The conductive material(s) 60 can be a film of ultradoped polysilicon superposed on metal, just a metallic deposit, or a composition of several metallic layers.

And more generally, the conductive material(s) 60 are selected from the following group: ultradoped polysilicon, Au, Ag, Ni, Pt, TiW, Cu, Pd, Al, Ti, TiN.

The deposit of at least one conductive material 60 is preferably done by a technique of low pressure chemical vapor deposition (LPCVD), but can also be done by evaporation, electrodeposition or pulverisation.

Also, even though the temperature is low and the pressure high, the film is polycrystalline and has homogeneous properties wherever it is deposited.

Such a deposit E2 has the advantage of being able to deposit a thick film of conductive material 60, having a thickness up to several tens of µm, in particular in deep cavities of the support 10 which could have been produced by the micro-machining of the support 10 to make the recesses 11. In other terms, the conductive material 60 fills all the cavities of the walls of the lateral recesses 11.

In this way, the conductive material or the conductive materials 60 are deposited onto the entire upper surface 101 of the support 10 and in the lateral recesses 11 (see FIG. 2).

Next, the manufacturing method comprises a step E3 of forming the electrical contacts 61. Such a step E3 is executed by photolithography associated with a hot 3D laminating technique or coating by pulverisation of photosensitive material "spray coating". In this way, the useful zones of the electrical contacts 61 are restrained precisely.

In fact, the 3D photolithography technique associated with a hot laminating technique or coating by pulverisation of photosensitive material defines deposit zones and saved zones on surfaces having strong topology; this technique controls the homogeneity of the deposit, even on inclined surfaces or at the base of the cavities. By way of example, this technique defines structures of the order of ten to a few tens of microns at the base of the recesses 11 which have a depth of the order of 500 µm, for a width at the base of the order of 100 µm.

After deposit E2 of at least one conductive material 60 during a single step, 3D photolithography allows machining of the materials deposited after the assembly E1 step between the support 10 and the membrane 20, and can accordingly realise E3 of complex structured forms exhibiting variations in height of several hundreds of µm, such as for example the interior of the recesses 11.

On completion of step E3 of formation of the electrical contacts the electrical contacts 61 are connected to the strain gauges 30 (see FIG. 2b) and extend from the upper surface 101 of the support 10.

Figure 1D:
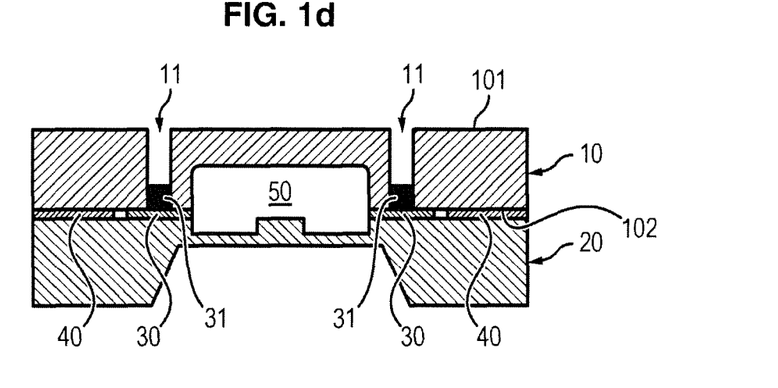
FIG. 1d illustrates the deposit of a diffusion barrier in keeping with a second embodiment of the invention.
Figure 2A:
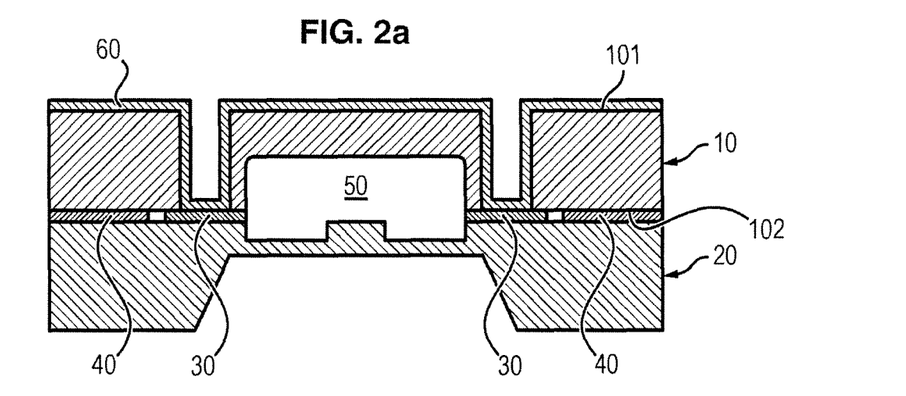
FIGS. 2a and 2b illustrate the deposit of one or more conductive materials according to a method in keeping with a first embodiment of the invention.
Figure 2B:
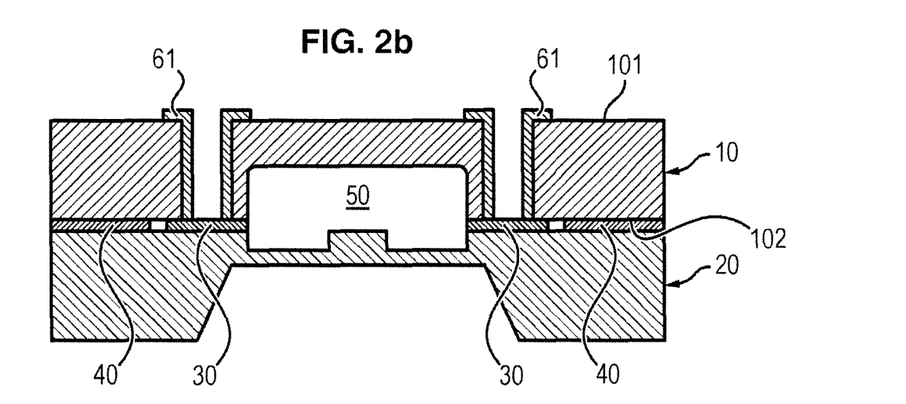
Figure 2C:
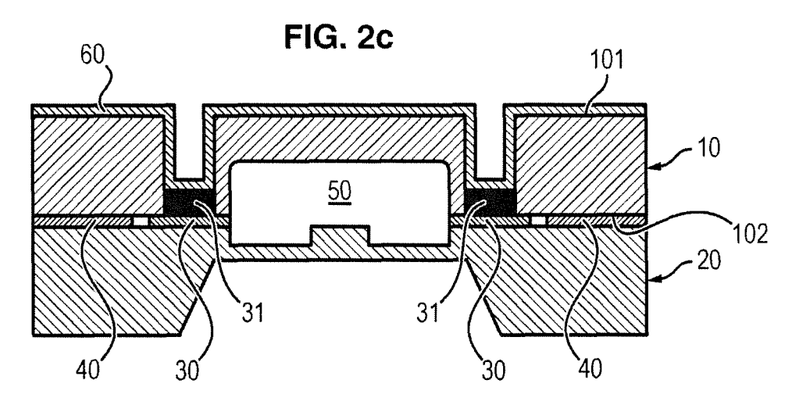
FIGS. 2c and 2d illustrate the deposit of one or more conductive materials according to a method in keeping with a second embodiment of the invention.
Figure 2D:
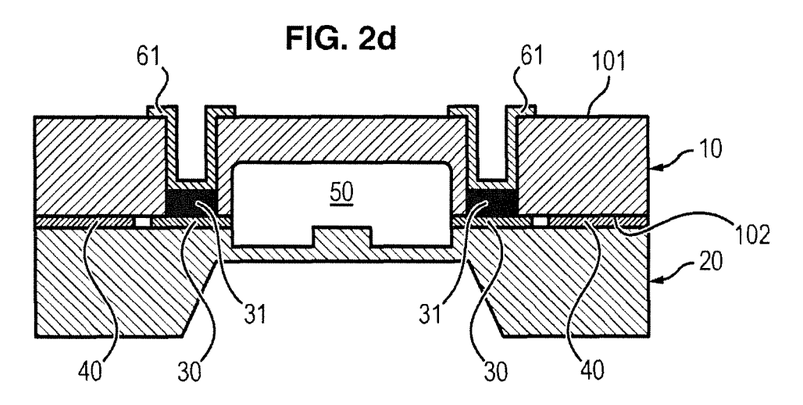
Figure 3:
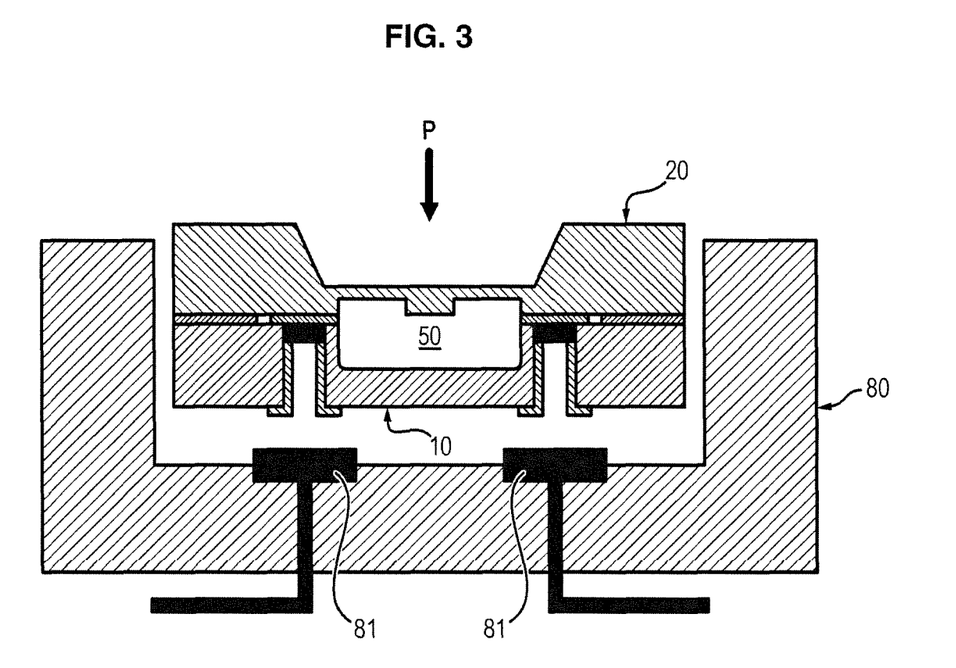
FIGS. 3 and 4 illustrate the packaging according to respectively a method in keeping with a first and a second embodiment of the invention.
Figure 4:
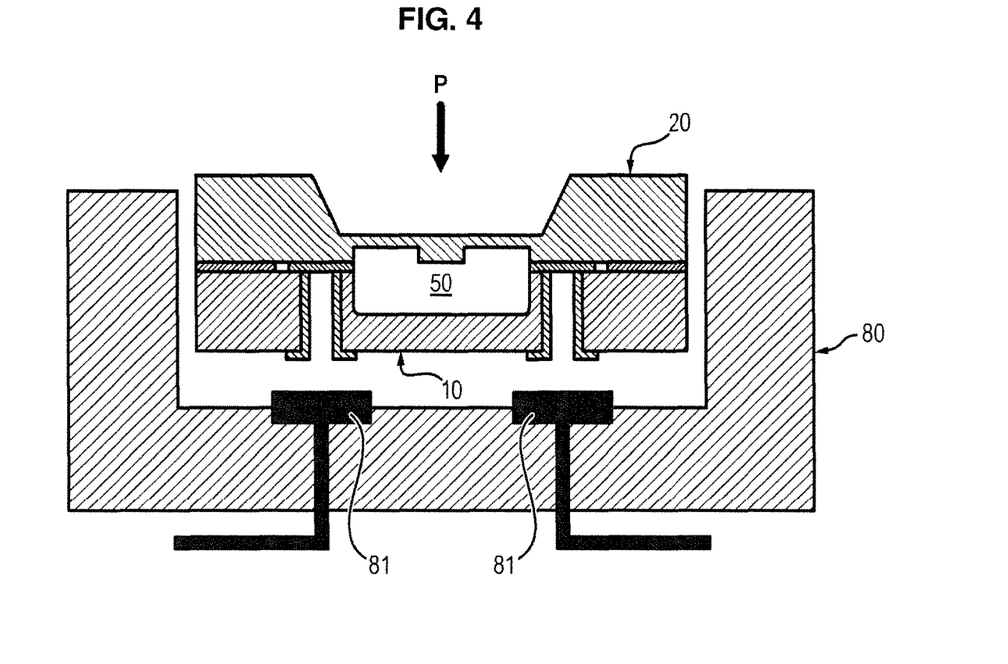
Figure 5:
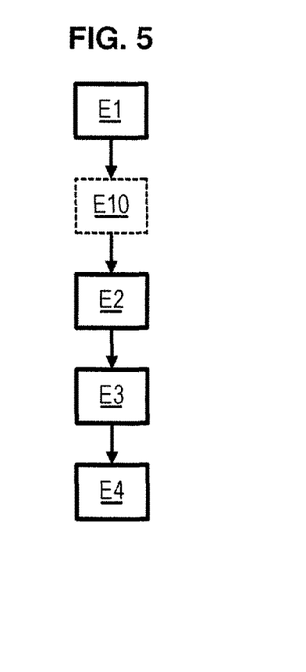
FIG. 5 illustrates steps of a method in keeping with an embodiment of the invention.

Alternatively or complementarily, once the assembly E1 is completed and prior to the single deposit step E2 of at least one conductive material 60, the manufacturing method comprises a deposit step E10 in each lateral recess 11 of a diffusion barrier 31 in contact with the corresponding strain gauges 30 (see FIG. 1d).

The diffusion barrier 31 comprises metal such as TiW, TiN, Pt, Ta, etc. More generally, the diffusion barrier 31 comprises material having properties allowing it to block diffusion of another atomic species in the strain gauges 30.

Next, as described previously, the electrical contacts are formed (step E3).

The diffusion barrier 31 is made of conductive material such as material serving to form electrical contacts. Therefore, as will be evident, in this embodiment in each lateral recess 11 the electrical contacts 61 are in contact with the diffusion barrier 31, itself in contact with the corresponding strain gauge 30. The diffusion barrier participates in the electrical contact 61 formed in each recess 11. After the electrical contacts 61 are made, the structure support 10 with deformable membrane 20 is integrated E4 into a casing 80 comprising electrical contacts 81.

The electrical contacts of the casing 80 are made of material selected from the following group: ultradoped polysilicon, Au, Ag, Ni, Pt, TiW, Cu, Pd, Al, Ti, TiN.

The casing 80 can comprise different materials, based on glass, ceramic or metal, or a mix of all three, and can take various forms.

The electrical contacts 81 of the casing 80 are arranged such that they are opposite the electrical contacts 61 of the support 10. The electrical connection between the contacts 61 and the contacts 81 can be made by the technique of wireless cabling "wire bonding" (a technique classically used for pressure sensors) or by a direct contact technique.

The electrical contacts 81 of the casing 80 extend to the exterior of the casing 80 to allow acquisition of electrical signals generated during measuring of the pressure P.

Different techniques such as the technique known as "Flip chip" can be carried out to integrate E4 the structure support 10/deformable membrane 20 into the casing 80.

A thermocompression method can be carried out in particular at a temperature between 200° C. and 500° C., and at pressure between 10 MPa and 250 MPa to connect the electrical contacts together.

The invention claimed is:

1. A manufacturing method of a pressure sensor comprising the following steps:
   providing a support substrate comprising an upper surface, a lower surface, a lateral recesses and a central recess;
   providing a deformable membrane comprising strain gauges, a thinned zone in its centre;
   assembling the support substrate with the deformable membrane for obtaining a micromechanical structure wherein the support substrate is arranged above the deformable membrane, the lower surface of the support substrate is in contact with the deformable membrane, the lateral recesses of the support substrate are arranged above the strain gauges and the central recess of the support substrate is arranged above the thinned zone of the deformable membrane;

and after said assembling of the support substrate with the deformable membrane, the method further comprising the step of forming electrical contacts in a single step of depositing at least one conductive material on the upper surface of the support substrate and in the lateral recesses of the substrate support, the conductive material extending into the recesses (11), wherein said depositing comprises placing the at least one conductive material in physical contact with the strain gauges (30) to form electrical contacts linked to the strain gauges.

2. The method according to claim 1, comprising a step of forming several electrical contacts executed by photolithography associated with a 3D hot laminating technique or coating by pulverisation of surfaces of strong topology.

3. The method according to claim 1, wherein the conductive material(s) are selected from the following group: ultradoped polysilicon, Au, Ag, Ni, Pt, TiW, Cu, Pd, Al, Ti, TiN.

4. The method according to claim 1, wherein the membrane is made of silicon and:
the support is made of glass, the assembly (E1) consisting of a anodic sealing; or
the support is made of silicon, the assembly consisting of sealing by means of a molecular or atomic bond with or without intermediate layer, or by brazing.

5. The method according to claim 1, wherein the membrane is formed from a substrate constituted by a monocrystalline silicon including Silicon on Sapphire (SOS), Silicon on Insulator (SOI), Porous Silicon on Insulator (PSOI), SiC on Insulator (SiCOI) and SiC.

6. The method according to claim 1, comprising a step consisting of:
integrating the support into a casing comprising electrical contacts made of conductive material; the support being integrated into the casing by means of connectors formed on the support.

7. The method according to claim 6, wherein integration of the support into the casing is completed by a thermocompression method.

8. The method according to claim 7, wherein the method of thermo compression is executed at a temperature between 250° C. and 500° C., typically 320° C. with pressure between 10 MPa and 200 MPa, typically 50 MPa.

9. The method according to claim 6, wherein the electrical contacts of the casing are made of material selected from the following group: ultradoped polysilicon, Au, Ag, Ni, Pt, TiW, Cu, Pd, Al, Ti, TiN.

10. The method according to claim 1, wherein integration of the support substrate into a casing is executed by means of the technique of the flipped chip.

11. A pressure sensor obtained by a method according to claim 1.

* * * * *